(12) United States Patent
Kim

(10) Patent No.: US 7,413,972 B2
(45) Date of Patent: Aug. 19, 2008

(54) METHOD OF FORMING A METAL INTERCONNECTION LINE IN A SEMICONDUCTOR DEVICE USING AN FSG LAYER

(75) Inventor: Hee-Dae Kim, Bucheon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 102 days.

(21) Appl. No.: 11/313,698

(22) Filed: Dec. 22, 2005

(65) Prior Publication Data

US 2006/0134900 A1    Jun. 22, 2006

(30) Foreign Application Priority Data

Dec. 22, 2004    (KR) .................. 10-2004-0110617

(51) Int. Cl.
*H01L 21/44* (2006.01)
(52) U.S. Cl. ............... 438/597; 438/622; 438/624; 257/E21.507
(58) Field of Classification Search .......... 438/597, 438/622, 624, 626
See application file for complete search history.

(56) References Cited

U.S. PATENT DOCUMENTS

| | | | | |
|---|---|---|---|---|
| 6,023,102 A | * | 2/2000 | Nguyen et al. ......... | 257/774 |
| 6,054,380 A | * | 4/2000 | Naik ................. | 438/624 |
| 2004/0018678 A1 | * | 1/2004 | Chung et al. .......... | 438/239 |
| 2004/0137648 A1 | * | 7/2004 | An .................... | 438/3 |
| 2005/0124149 A1 | * | 6/2005 | Kim et al. ............ | 438/618 |

FOREIGN PATENT DOCUMENTS

| | | |
|---|---|---|
| KR | 10-2004-0017905 | 3/2004 |
| KR | 10-2004-0108032 | 12/2004 |

* cited by examiner

*Primary Examiner*—Bradley W. Baumeister
*Assistant Examiner*—Victor V Yevsikov
(74) *Attorney, Agent, or Firm*—Lowe Hauptman Ham & Berner LLP

(57) ABSTRACT

A method of forming a metal line in a semiconductor device using a fluorine doped silica glass (FSG) insulation layer. The method includes forming a lower metal layer on a insulation layer on a semiconductor substrate, forming a metal oxide layer on a sidewall of the lower metal layer, forming a barrier insulation layer covering the lower metal layer and metal oxide layer, forming an FSG insulation layer on the barrier insulation layer, forming a via contact that penetrates the FSG insulation layer so as to connect to the lower metal layer, and forming an upper metal layer electrically connected to the via contact.

8 Claims, 6 Drawing Sheets

METHOD OF FORMING A METAL INTERCONNECTION LINE IN A SEMICONDUCTOR DEVICE USING AN FSG LAYER

CROSS-REFERENCE TO RELATED APPLICATION

This application claims priority to and the benefit of Korean Patent Application No. 10-2004-0110617 filed in the Korean Intellectual Property Office on Dec. 22, 2004, the entire contents of which are incorporated herein by reference.

BACKGROUND OF THE INVENTION (a) Field of the Invention

The present invention relates to a method of manufacturing a semiconductor device. More particularly, the present invention relates to a method of forming a metal line in a semiconductor device using an FSG insulation layer.

(b) Description of the Related Art

An undoped silica glass (USG) insulation layer or fluorine doped silica glass (FSG) insulation layer is usually used as an inter-metal dielectric (IMD) layer in order to form a metal line of a semiconductor device, such as a metal oxide semiconductor (MOS) transistor.

Compared to a USG insulation layer, an FSG insulation layer has a merit in that it can obtain a fast operation speed due to its low dielectric constant (low-k).

However, since an FSG insulation layer includes fluorine, which is an active element, undesired reactions between fluorine and other materials may occur. Such a drawback of an FSG layer will be now described with reference to the accompanying drawings.

FIG. 1 to FIG. 4 are cross-sectional views showing a conventional method of forming a metal line in a semiconductor device using an FSG layer.

Referring to FIG. 1, a lower metal layer 120 is formed on an insulation layer 110 on a semiconductor substrate 100. Although not shown in the drawing, the lower metal layer 120 is electrically connected to another conductive layer at its lower part.

In the case of a MOS transistor, the lower metal layer 120 may be connected to a gate electrode layer or an impurity region in the semiconductor substrate 100.

Referring to FIG. 2, a liner oxide layer 130 is formed on the insulation layer 110 and lower metal layer 120. The liner oxide layer 130 is formed to a thickness of about 800 Å using a chemical vapor deposition (CVD) method.

Referring to FIG. 3, an FSG insulation layer 140 is formed on the liner oxide layer 130. The FSG insulation layer is used as an IMD layer. The FSG insulation layer 140 may also be formed by a CVD method. Subsequently, a USG insulation layer 150 is formed on the FSG insulation layer 140.

Referring to FIG. 4, a via hole 160 penetrating the USG insulation layer 150, FSG insulation layer 140, and liner oxide layer 130 is formed to a degree such that a portion of an upper surface of the lower metal layer 120 is exposed.

In addition, a via contact 170 is formed by filling the inside of the via hole 160 with tungsten W.

Subsequently, an upper metal layer 180 is formed on the USG insulation layer 150 so as to electrically connect to the via contact 170.

However, during a conventional method of forming a metal line in a semiconductor device, the liner oxide layer 130 may not be uniformly deposited on both an upper surface of the lower metal layer 120 and lateral sides thereof. That is, the liner oxide layer is deposited in the desired thickness on the upper surface of the lower metal layer 120, but it is deposited in a relatively small thickness on the lateral sides thereof.

Therefore, since the liner oxide layer 130 on the lateral sides of the lower metal layer 120 cannot properly perform a function of a barrier layer, undesired reactions between fluorine in the FSG insulation layer 140 and materials in the lower metal layer 120 may occur. For example, when the lower metal layer 120 is an aluminum layer, AlF gas may be created by the reaction between aluminum and fluorine.

Consequently, such AlF gas may induce defects of a semiconductor device because the via contact 170 is unstably formed in the subsequent process.

The above information disclosed in this Background section is only for enhancement of understanding of the background of the invention and therefore it may contain information that does not form part of the prior art with respect to the present invention.

SUMMARY OF THE INVENTION

The present invention has been made in an effort to provide a method of forming a metal line in a semiconductor device having advantages of preventing undesired reactions between fluorine in an FSG insulation layer and metal materials in a lower metal layer.

An exemplary method of forming a metal line according to an embodiment of the present invention includes forming a lower metal layer on a insulation layer on a semiconductor substrate, forming a metal oxide layer on a sidewall of the lower metal layer, forming a barrier insulation layer covering the lower metal layer and metal oxide layer, forming a fluorine-doped silica glass (FSG) insulation layer on the barrier insulation layer, forming a via contact which penetrates the FSG insulation layer so as to connect to the lower metal layer, and forming an upper metal layer that is electrically connected to the via contact.

The metal oxide layer can be formed by an annealing process for the substrate including the lower metal layer, under an oxygen atmosphere. Here, the annealing process can be performed at a temperature of 380-415° C. in order to prevent damage to a metal line. The barrier insulation layer can be formed as a liner oxide layer. The liner oxide layer can be formed by using a CVD method. According to an exemplary embodiment of the present invention, an undoped silica glass (USG) insulation layer can be formed on the fluorine-doped silica glass (FSG) insulation layer.

DETAILED DESCRIPTION OF THE EMBODIMENTS

Figure 1:
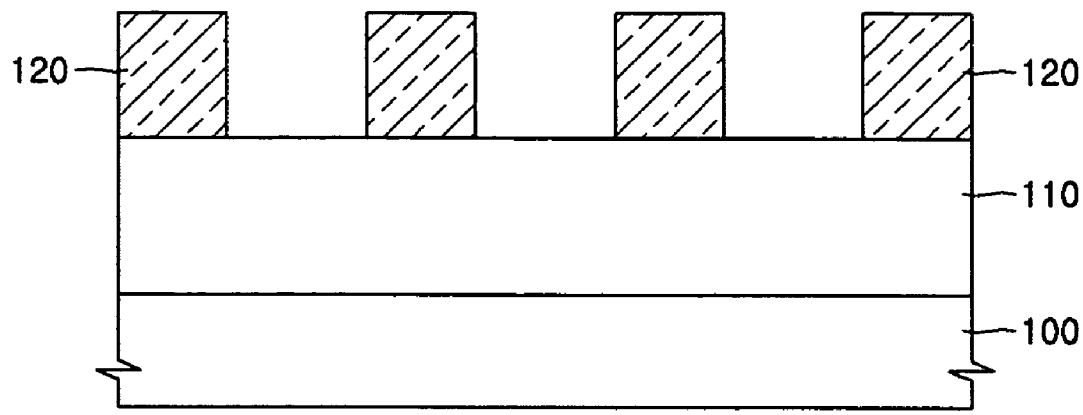
FIG. 1 to FIG. 4 are cross-sectional views showing a conventional method of forming a metal line in a semiconductor device using an FSG insulation layer.
Figure 2:
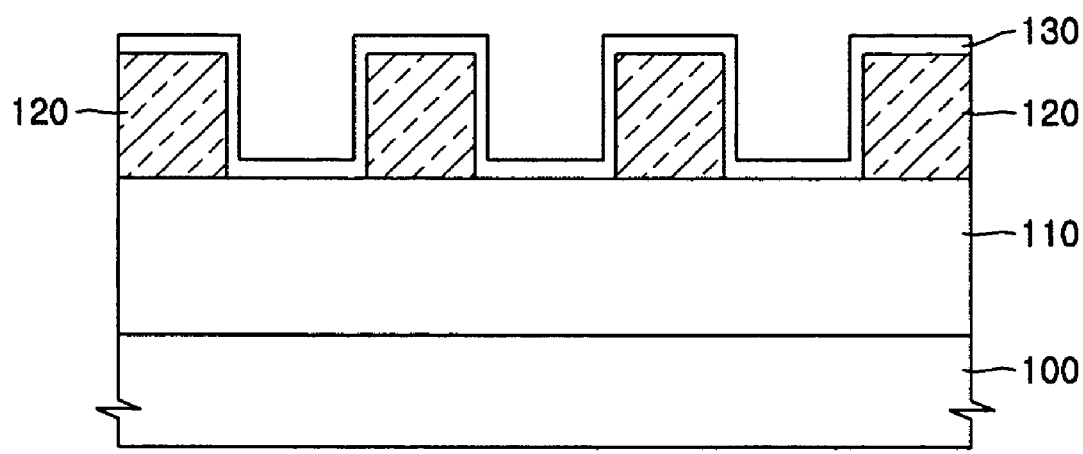
Figure 3:
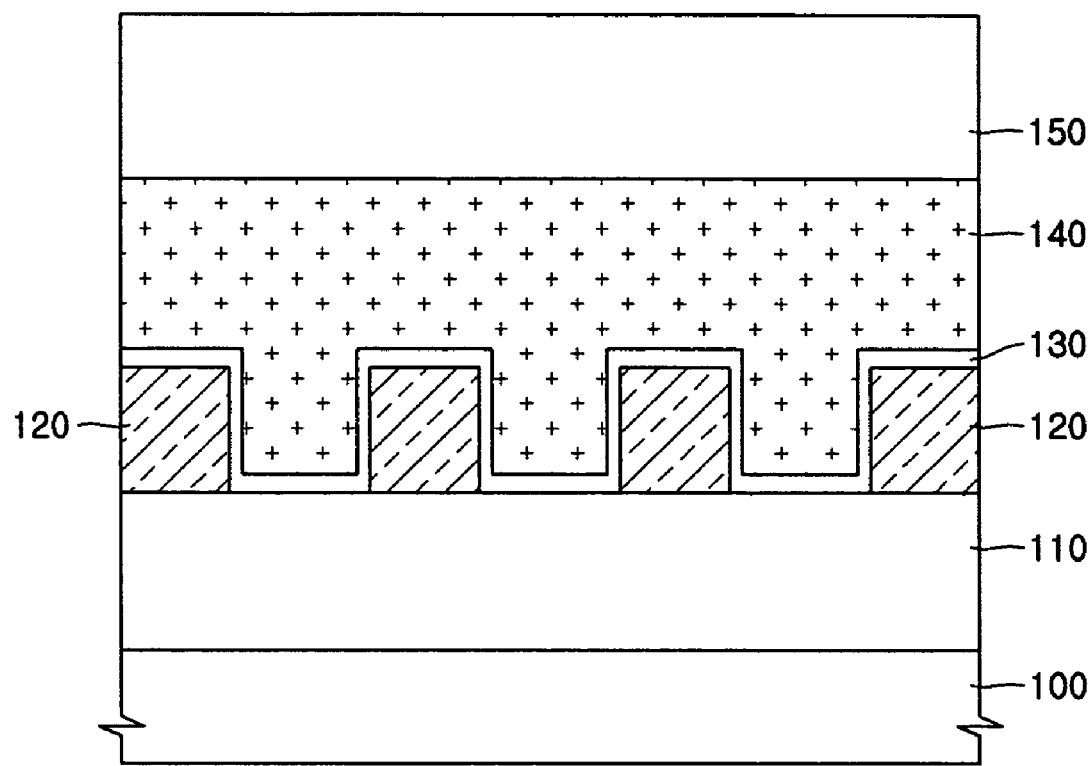
Figure 4:
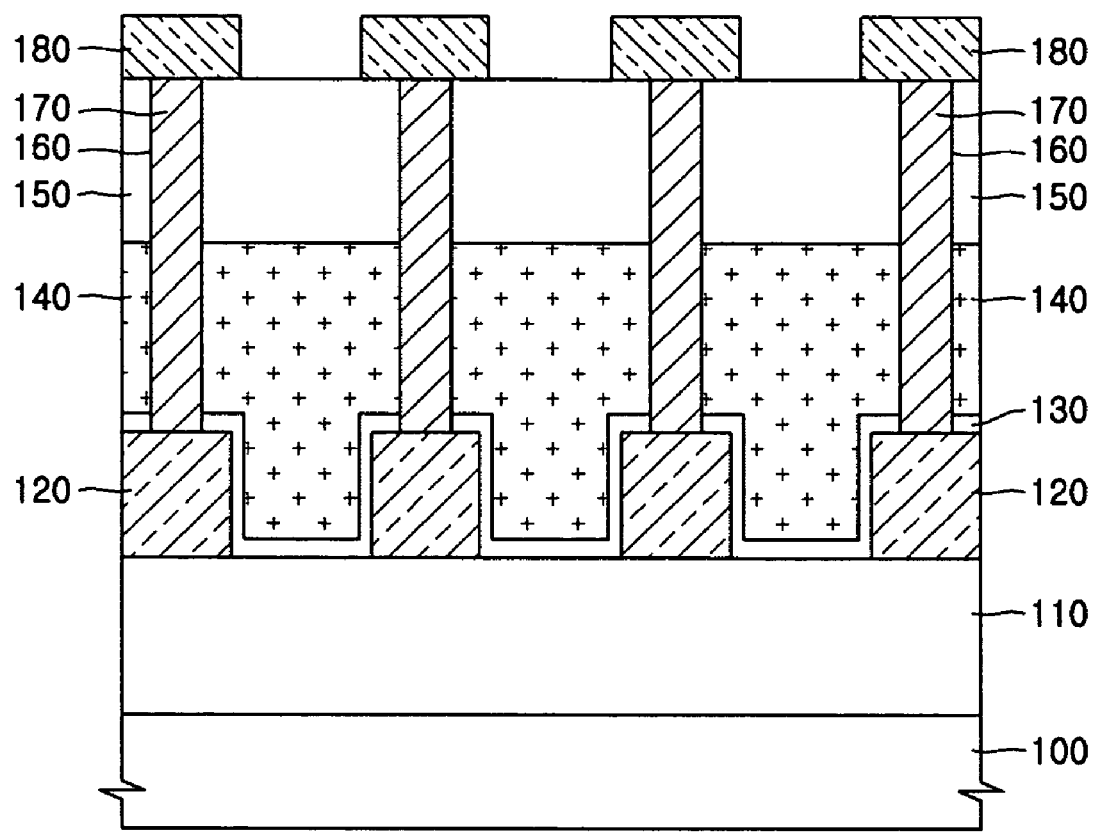

An exemplary embodiment of the present invention will hereinafter be described in detail with reference to the accompanying drawings. However, exemplary embodiments of the present invention can be variously modified, and it should not be understood that the scope of the present invention is limited to the exemplary embodiments.

To clarify multiple layers and regions, the thicknesses of the layers are enlarged in the drawings. Like reference numerals designate like elements throughout the specification. When it is said that any part, such as a layer, film, area, or plate is positioned on another part, it means the part is directly on the other part or above the other part with at least one intermediate part. On the other hand, if any part is said to be positioned directly on another part, it means that there is no intermediate part between the two parts.

FIG. 5 to FIG. 9 are cross-sectional views showing a method of forming a metal line in a semiconductor device using an FSG insulation layer according to an exemplary embodiment of the present invention.

Figure 5:
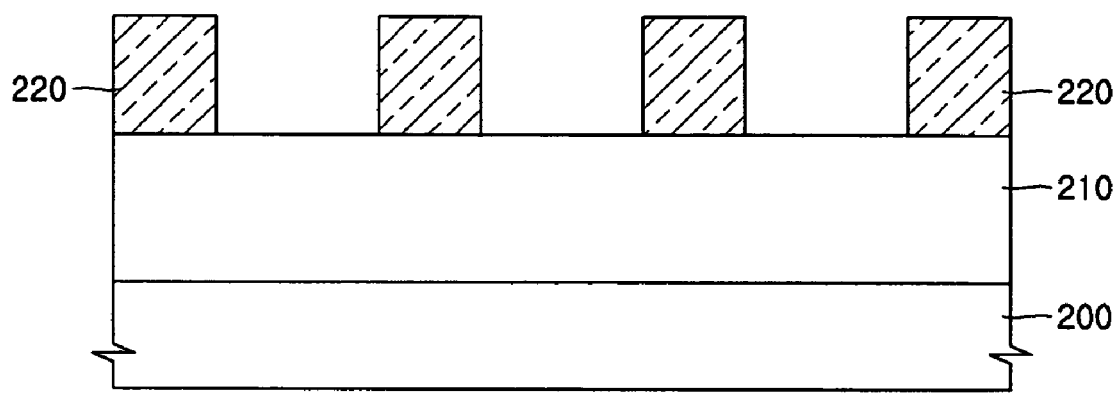
FIG. 5 to FIG. 9 are cross-sectional views showing a method of forming a metal line in a semiconductor device using an FSG insulation layer according to an exemplary embodiment of the present invention.

Referring to FIG. 5, a lower metal layer 220 is formed on an insulation layer 210 on a semiconductor substrate 200. Although not shown in the drawing, the lower metal layer 220 is electrically connected to another conductive layer at its lower part.

In the case of a MOS transistor, the lower metal layer 220 can be connected to a gate electrode layer or an impurity region in the semiconductor substrate 200. The lower metal layer 220 can be formed as an aluminum layer, but it is not limited thereto.

Figure 6:
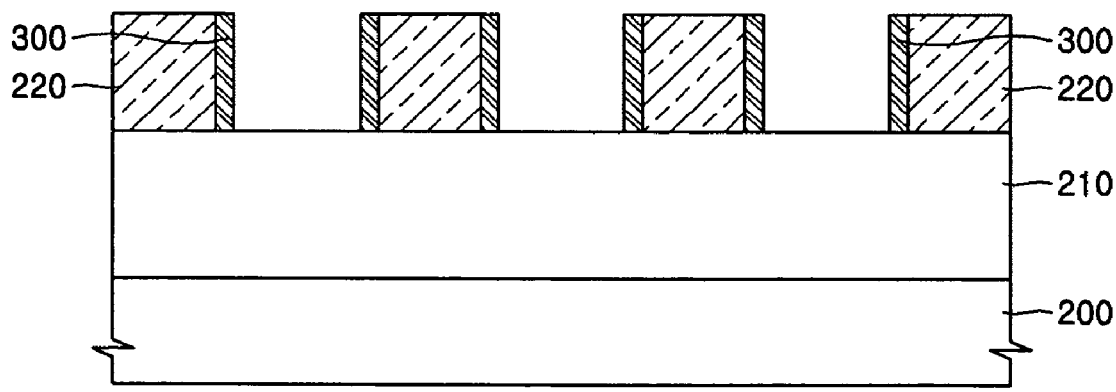

Referring to FIG. 6, a metal oxide layer 300 is formed on a sidewall of the lower metal layer 220. The metal oxide layer 300 can be formed by performing an annealing process under an oxygen atmosphere.

That is, after loading the substrate including the insulation layer 210 and lower metal layer 220 into a furnace, an annealing process is performed under an oxygen atmosphere.

The annealing process should be performed between 380-415° C. in order to prevent damage to a metal line. In some cases, the annealing process can be performed under a nitrogen atmosphere with added oxygen.

Consequently, as shown in FIG. 6, a metal oxide layer 300 is formed on the sidewall of the lower metal layer 220. Here, the metal oxide layer 300 can be formed as an aluminum oxide layer, but it is not limited thereto.

Figure 7:
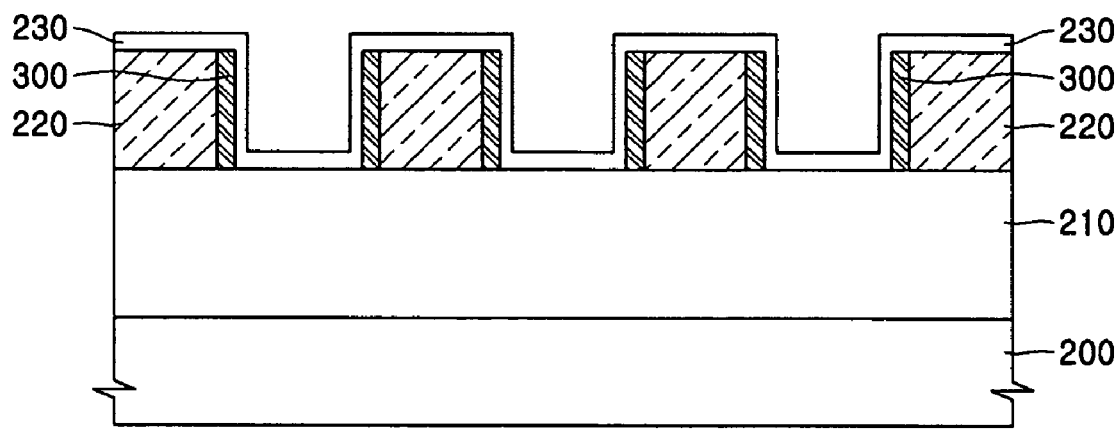

Referring to FIG. 7, a liner oxide layer 230 is formed on the insulation layer 210, lower metal layer 220, and metal oxide layer 300. The liner oxide layer 230 is formed to a thickness of about 800 Å using a chemical vapor deposition (CVD) method.

Even if the liner oxide layer 230 has a smaller thickness on the metal oxide layer 300 attached to a lateral side of the lower metal layer 220 than on an upper surface of the lower metal layer 220, the metal oxide layer 300 can prevent undesired reactions between fluorine in an FSG insulation layer and metal materials in the lower metal layer 200.

Figure 8:
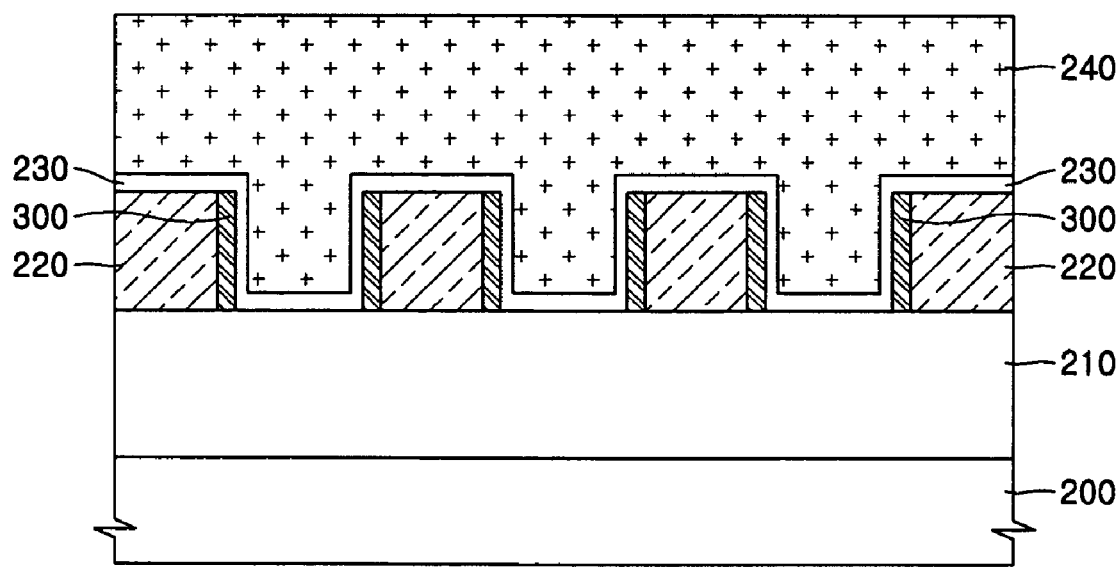

Subsequently, referring to FIG. 8, an FSG insulation layer 240 is formed on the liner oxide layer 230. The FSG insulation layer 240 is used as an IMD layer. The FSG insulation layer 240 can also be formed by a CVD method.

Subsequently, a USG insulation layer 250 is formed on the FSG insulation layer 240. The FSG insulation layer 240 and USG insulation layer 250 perform the function of an inter-metal insulation layer.

It should be understood that the USG insulation layer 250 is not always necessary. That is, depending on the case, the USG insulation layer 250 can be omitted, or another insulation layer can be deposited in replacement of or in addition to the USG insulation layer 250.

Figure 9:
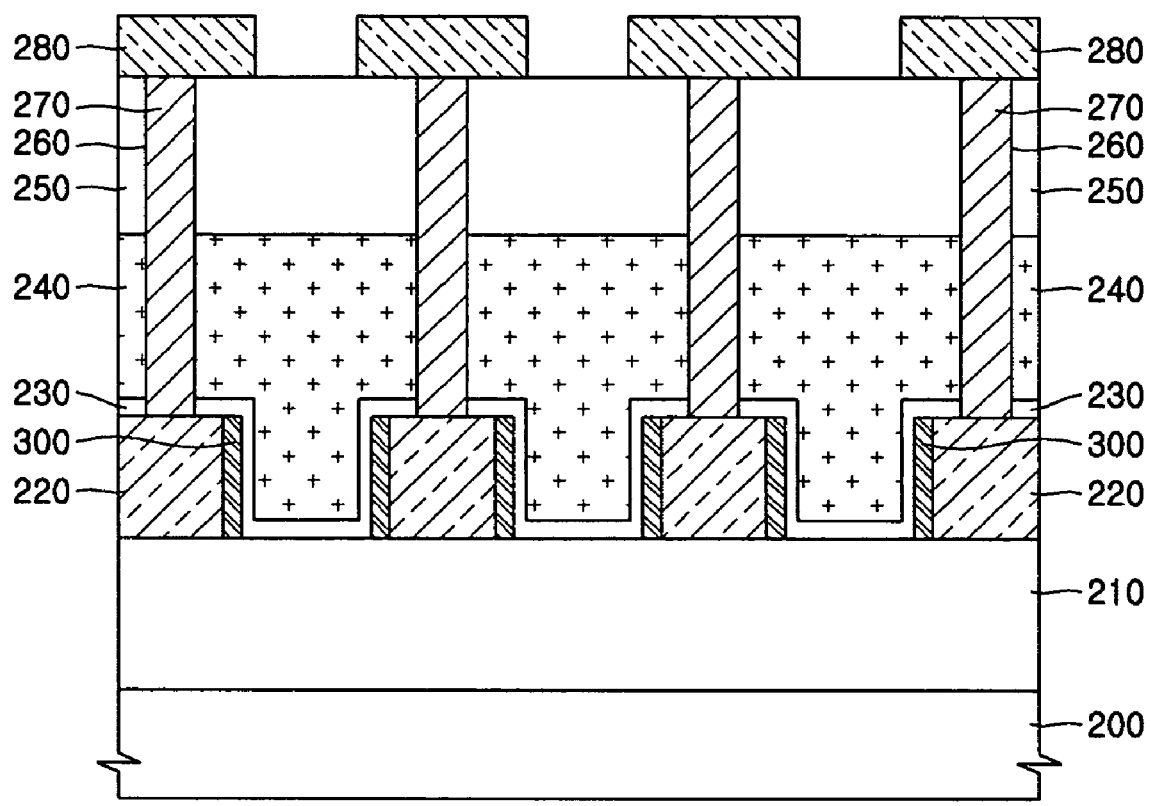

Referring to FIG. 9, a via hole 260 penetrating the USG insulation layer 250, FSG insulation layer 240, and liner oxide layer 230 is formed to a degree such that a portion of an upper surface of the lower metal layer 220 is exposed.

A mask layer pattern (not shown) is formed on the USG insulation layer 250 in order to form the via hole 260, and an etching process is performed using such a mask layer pattern as an etch mask to a degree that an upper surface of the lower metal layer 220 is exposed.

After forming the via hole 260, a via contact 270 is formed by filling the inside of the via hole 260 with tungsten W.

Subsequently, an upper metal layer 280 is formed on the USG insulation layer 250 so as to electrically connect to the via contact 270. In some cases, the above-mentioned process is repeatedly performed in order to form a metal line having a multi-layered structure.

As described above, according to an exemplary method of the present invention, a metal oxide layer is formed on a sidewall of a lower metal layer by an annealing process under an oxygen atmosphere before forming a liner oxide layer.

Therefore, even though the liner oxide layer has a relatively small thickness on a lateral side of a lower metal layer, the metal oxide layer can prevent undesired reactions between fluorine in an FSG insulation layer and metal materials in the lower metal layer.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method of forming a metal line in a semiconductor device, comprising:
    forming a lower metal layer on an insulation layer on a semiconductor substrate;
    forming a metal oxide layer on a sidewall of the lower metal layer;
    forming a barrier insulation layer covering the lower metal layer and metal oxide layer;
    forming a fluorine doped silica glass (FSG) insulation layer on the barrier insulation layer;
    forming a via contact that penetrates the FSG insulation layer and the barrier insulation layer so as to directly contacts the lower metal layer without the interposition of a layer between the via contact and sides of the FSG insulation layer; and
    forming an upper metal layer electrically connected to the via contact.

2. The method of claim 1, wherein the forming of the metal oxide layer is performed by an annealing process for the substrate including the lower metal layer, under an oxygen atmosphere.

3. The method of claim 2, wherein the annealing process is performed at a temperature of 380-415° C. in order to prevent damage to a metal line.

4. The method of claim 1, wherein the barrier insulation layer is formed as a liner oxide layer.

5. The method of claim 4, wherein the liner oxide layer is formed by using a CVD method.

6. The method of claim 1, further comprising forming an undoped silica glass (USG) insulation layer on the fluorine doped silica glass (FSG) insulation layer.

7. The method of claim 1, wherein the metal layer is formed as an aluminum layer.

8. The method of claim 1, wherein the metal oxide layer is formed as an aluminum oxide layer.

* * * * *